United States Patent [19]

Sakamoto et al.

[11] Patent Number: 5,032,541
[45] Date of Patent: Jul. 16, 1991

[54] METHOD OF PRODUCING A SEMICONDUCTOR DEVICE INCLUDING A SCHOTTKY GATE

[75] Inventors: Shinichi Sakamoto; Takuji Sonoda; Kazuo Hayashi, all of Itami, Japan

[73] Assignee: Mitsubishi Denki Kabushiki Kaisha, Japan

[21] Appl. No.: 396,149

[22] Filed: Aug. 21, 1989

[30] Foreign Application Priority Data

Sep. 14, 1988 [JP] Japan ................. 63-230941

[51] Int. Cl.$^5$ ............................................. H01L 21/338
[52] U.S. Cl. ...................... 437/203; 437/36; 437/38; 437/177; 437/40; 437/912; 437/944; 437/39; 437/228; 437/194
[58] Field of Search .............. 437/203, 36, 38, 177, 437/179, 912, 944, 192, 40, 39, 228, 194

[56] References Cited

U.S. PATENT DOCUMENTS 4,551,905 11/1985 Chao et al. ..................... 437/944
4,923,827 5/1990 Calviello et al. ................ 437/179

FOREIGN PATENT DOCUMENTS 55-128875 10/1980 Japan ........................... 437/179
60-225477 11/1985 Japan .
61-67272 4/1986 Japan .

OTHER PUBLICATIONS

Ghandhi, S. K., VLSL Fabrication Principles, John Wiley & Sons, 1983, pp. 598-605.
Tampo et al., "Low Noise GaAs ... for MMIC", Institute of Japanese Electronics ... Engineers, Electron Devices (1987) pp. 7-11.
Kato et al., "Two-Layer Resist ... GaAs Device", IEEE Transactions on Electron Devices, vol. ED-34, No. 4, Apr. 1987, pp. 753-758.

Primary Examiner—Brian E. Hearn
Assistant Examiner—T. N. Quach
Attorney, Agent, or Firm—Leydig, Voit & Mayer

[57] ABSTRACT

A method of producing a semiconductor device includes etching a recessed aperture in a substrate, forming a gate electrode in the aperture, burying the gate electrode with resist, etching the resist to expose the gate electrode, depositing a high conductivity metal on the gate electrode, and forming ohmic electrodes on opposite sides of the gate electrode by a series of processing steps.

11 Claims, 5 Drawing Sheets

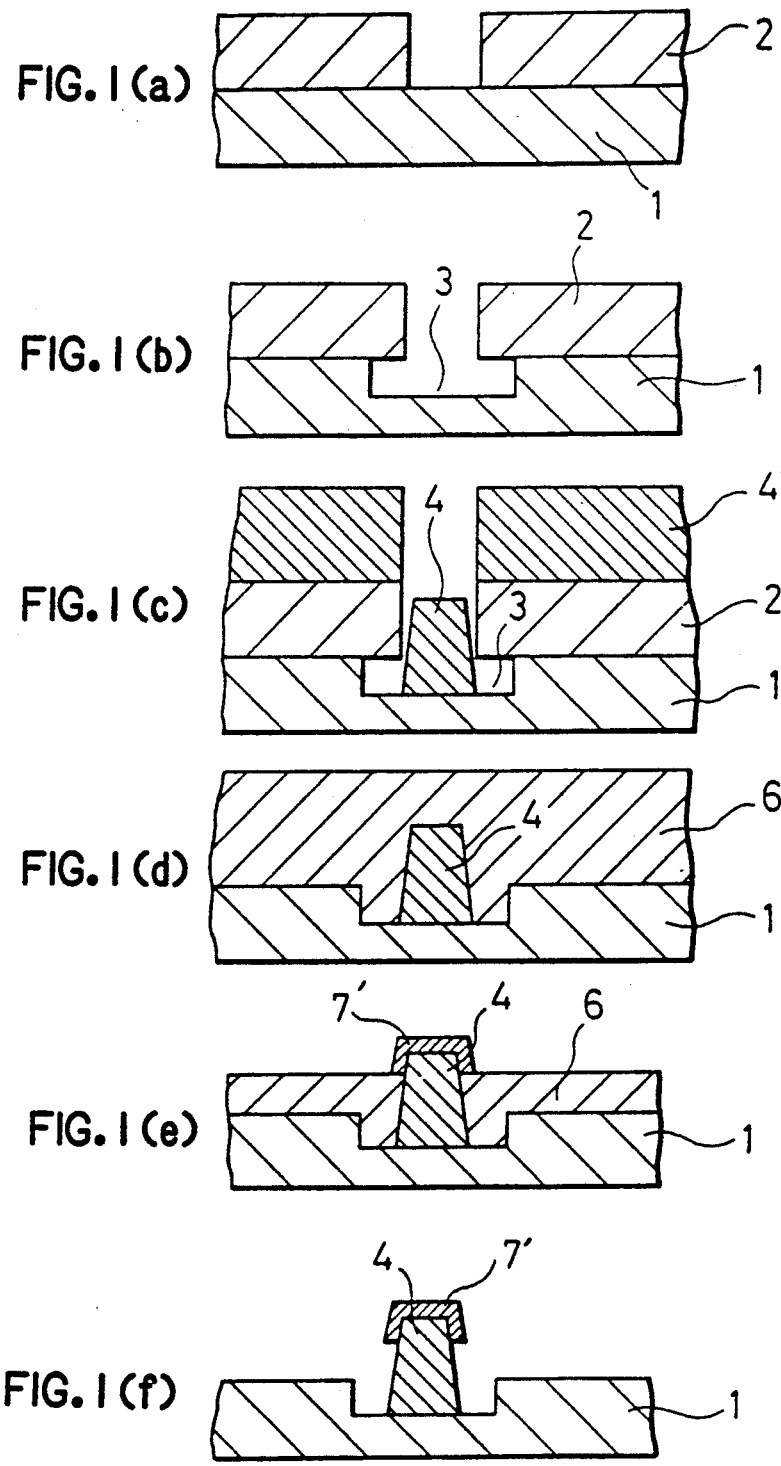

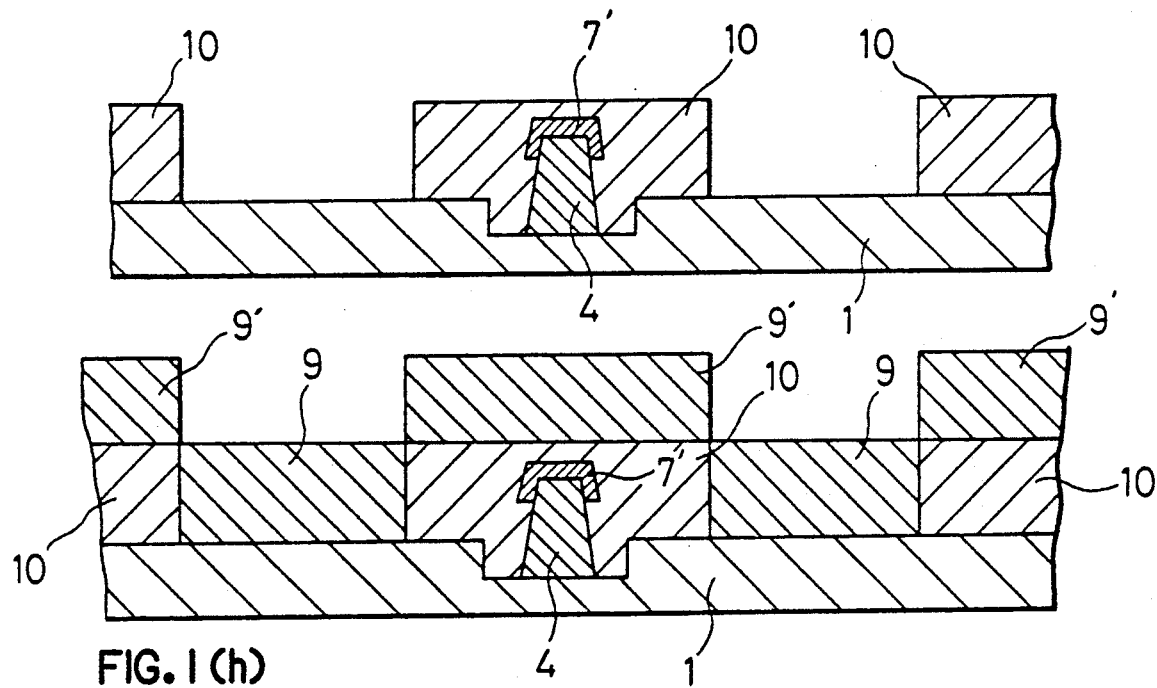
FIG. 1(g)
FIG. 1(h)
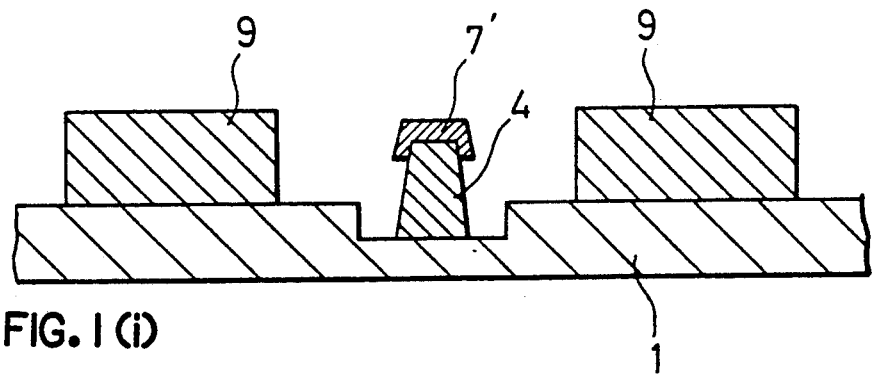
FIG. 1(i)

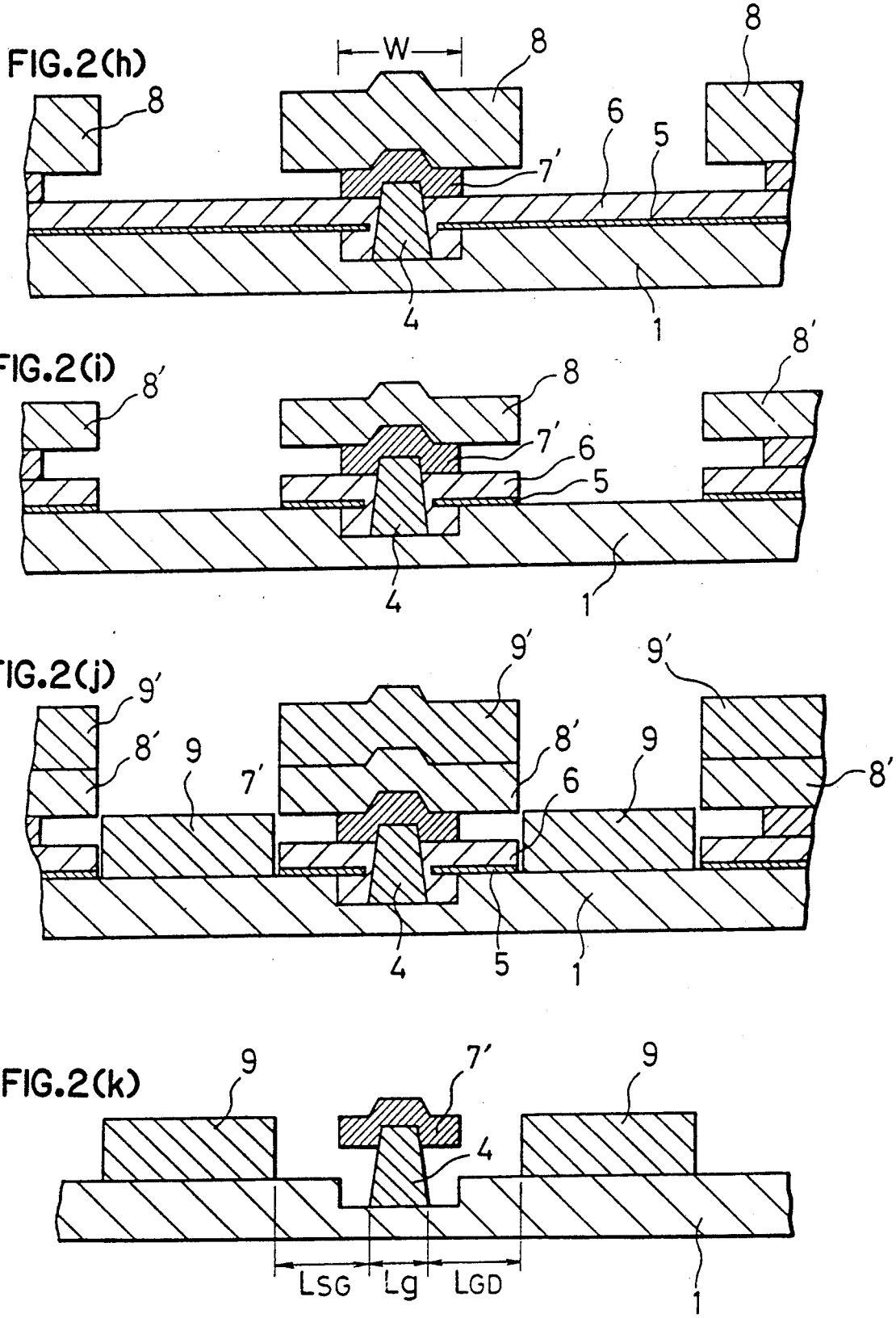

METHOD OF PRODUCING A SEMICONDUCTOR DEVICE INCLUDING A SCHOTTKY GATE

FIELD OF THE INVENTION

The present invention relates to a method of producing a semiconductor device and, more particularly to a method of producing a gate electrode of, for example, a GaAs FET.

BACKGROUND OF THE INVENTION

Conventionally, the gate electrode of, for example, an FET is produced by the production process shown in FIGS. 3(a) to 3(d). FIGS. 3(a) to 3(d) illustrates a main surface 1 of, for example, a field effect transistor (hereinafter referred to as FET), a resist 2, a recess etching aperture 3, a gate electrode 4, and gate electrode metal 4'.

The production process of the FET will be described.

First of all, resist 2 is deposited on the main surface 1 and an aperture in the resist is formed by photolithography (FIG. 3(a)).

Next, etching is carried out using the resist 2 as a mask thereby to produce a recess aperture 3 (FIG. 3(b)). Next, gate electrode metal is deposited on the entire surface of substrate by, for example, evaporation or sputtering (FIG. 3(c)). The unneeded portion of the gate electrode metal 4' and resist 2 are removed by the lift-off method, thereby to complete a portion of a semiconductor device (FIG. 3(d)).

Generally, in order to enhance the performance of a high frequency FET, reduction in the gate length (Lg) and gate resistance (Rg) are required. In the prior art method of producing a semiconductor device, in order to reduce the gate length, a narrow gate pattern is produced and thereafter the gate electrode 4 is produced. Although the gate length can be reduced by this method, the cross section of the gate electrode 4 unfavorably comes to have a trapezoidal cross-section as shown in FIG. 3(d) or in an extreme case, a triangular cross-section. Since the cross sectional area of the gate electrode 4 is reduced, in the gate resistance is increased. Accordingly, a in the gate length and reduction in the gate resistance cannot be achieved at the same time.

SUMMARY OF THE INVENTION

An object of the present invention is to provide a method of producing a semiconductor device capable of reducing the gate length and further capable of suppressing an increase in the gate resistance.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, a gate electrode having a short gate length is produced by evaporating gate electrode material using a narrow gate pattern as a mask. Thereafter resist is deposited on the entire surface of substrate to cover and bury the gate electrode portion. Subsequently, the resist is made thinner to expose the top portion of the gate electrode and a high conductivity metal is plated at the top portion of the gate electrode by electroless plating. This high conductivity metal is deposited as a second wide electrode. Thereafter, an ohmic electrode is produced at each side of the gate electrode by a lift-off method.

According to another aspect of the present invention, a gate electrode having a short gate length is produced simply by a conventional method, the gate electrode is buried by a resist, and the resist is made thinner to expose the top portion of the gate electrode on the surface of the resist. A high conductivity metal is plated on the entire surface of substrate by, for example, evaporation. The high conductivity metal is etched using a resist pattern so that the metal remains only on the gate electrode. Thereafter ohmic electrodes are produced at each side of the gate electrode self-aligningly using the resist pattern which is used as a mask for etching the high conductivity metal. At least, the high conductivity metal is adhered to the gate electrode strongly by annealing, thereby making a second wide electrode which is connected to the gate electrode.

Thus, the gate electrode has a reduced gate length and a wide electrode is attached to the upper portion of the electrode, whereby the cross sectional area of the gate electrode is increased, and the gate length (Lg) is reduced while suppressing an increase in the gate resistance.

BRIEF DESCRIPTION OF THE DRAWINGS

FIGS. 1(a) to 1(i) are cross sectional views showing the respective production process steps for producing a semiconductor device according to a first embodiment of the present invention;

FIGS. 2(a) to 2(k) are cross sectional views showing the respective production process steps for producing a semiconductor device according to a second embodiment of the present invention.

DETAILED DESCRIPTION OF THE PREFERRED EMBODIMENTS

Figure 2A:
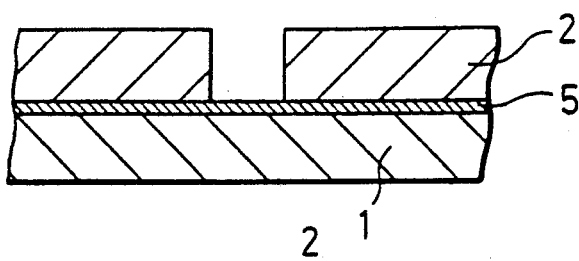

An embodiment of the present invention will be described in detail with reference to the drawings.

FIGS. 1(a) to 1(i) show cross sectional views of respective production process steps for producing a semiconductor device according to a first embodiment of the present invention. Those Figures illustrates a main surface 1 of, for example, an FET, resist 2, a recess etching aperture 3, a gate electrode 4, gate electrode metal 4', resist 6, a high conductivity metal 7', an ohmic electrode 9, an ohmic electrode metal 9', and resist 10.

The production method will be described.

First of all, resist 2 is applied to the main surface of substrate 1 and a gate pattern is formed by photolithography (FIG. 1(a)). Next, etching is carried out using the resist 2 as a mask, thereby producing a recessed aperture 3 in the substrate 1 of 2000 Å to 3000 Å depth (FIG. 1(b)). Thereafter, a gate electrode metal is deposited on the entire surface of substrate to a thickness of about 5000 Å to 1 micron by evaporation or sputtering (FIG. 1(c)). The unneeded portion of the gate electrode metal 4' and resist 2 are removed by, for example, the lift-off method, thereby to produce a gate electrode 4 having a gate length (Lg) below 0.5 micron (FIG. 1(d)). The processes up until this step are the same as those of the prior art.

Thereafter, the gate electrode portion 4 and the recess aperture portion 3 are buried by resist 6, and the resist 6 is etched by anisotropic reactive ion etching (hereinafter referred to as "RIE") up until the top portion of the gate electrode 4 is exposed to the surface of resist 6. A high conductivity metal 7' of, for example, gold is plated on the upper portion of the gate electrode 4 by electroless plating (FIG. 1(e)).

Thereafter, the resist 6 is removed, to produce a wide second electrode on the gate electrode 4 (FIG. 1(f)).

Next, resist 10 is applied over the entire surface of substrate, ohmic electrode patterns are produced (FIG. 1(g)), and thereafter ohmic electrode metals 9 are deposited on the entire surface of substrate (FIG. 1(h)).

Thereafter, the unneeded portions of ohmic electrode metals 9' and resist 10 are removed, for example, by the lift-off method, and ohmic electrodes 9 are produced on opposite sides of the gate electrode 4 (FIG. 1(i)).

In such an embodiment, the gate electrode 4 having a short gate length can be produced by a process similar to that of the prior art a high process up to FIG. 1(d). In subsequent conductivity metal 7' as a second electrode is disposed on the top portion of the gate electrode 4, thereby increasing the cross sectional area of the gate electrode and reducing the gate resistance. This lower gate resistance reduces the minimum noise figure and to increases the gain in such an FET, and provides semiconductor device having a high performance, especially at high frequencies.

FIGS. 2(a) to 2(k) show cross sectional views of the respective production process steps for producing a semiconductor device according to a second embodiment of the present invention.

FIGS. 2(a) to 2(k) reference numerals 1, 2, 3, 4, and 4' similarly designate a main surface of, for example, an FET, resist, a recess etching aperture, a gate electrode, and gate electrode metal, respectively. Further, FIGS. 2(a) to 2(k) include a SiN series or SiO series spacer 5, resist 6, high conductivity metal 7 and 7', resist 8 and 8', and ohmic electrodes 9 and ohmic electrode metals 9'.

The production process will be described.

At first, a spacer made of a glass material, comprising $Si_3N_4$ or $SiO_2$ is deposited on the main surface 1 by, for example, CVD to a thickness of about 1000 Å to make a spacer 5. Thereafter resist 2 is applied to the spacer 5, and a narrow gate pattern is formed by photolithography (FIG. 2(a)).

Figure 2B:
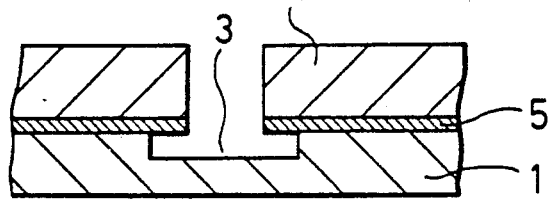

Next, the gate electrode portion is etched using the resist 2 as a mask, and a recess etching aperture 3 of 2000 to 3000 Å in depth is produced (FIG. 2(b)).

Figure 2C:
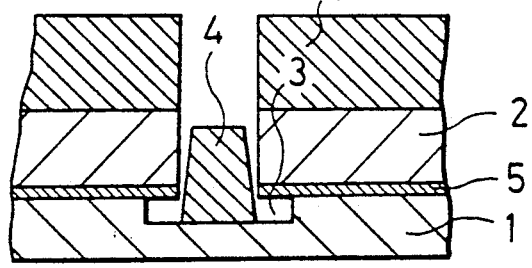
Figure 2D:
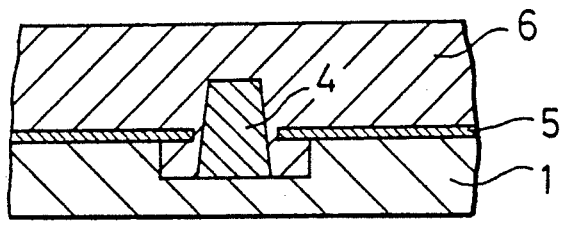

Then, a gate electrode metal of, for example, aluminum is deposited on the entire surface of substrate to a thickness of about 5000 Å to 1 micron by evaporation or sputtering (FIG. 2(c)). The unneeded portion of the gate electrode metal 4' and resist 2 are removed by, for example, the lift-off method, and the gate electrode 4 of gate length (Lg) below 0.5 micron is produced (FIG. 2(d)).

Figure 2E:
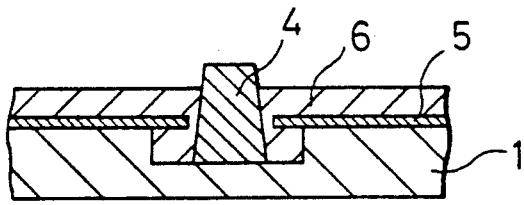

Thereafter, the gate electrode 4 is buried by resist 6, and the resist 6 is etched by RIE until the top portion of the gate electrode 4 is exposed to the surface of resist 6 (FIG. 2(e)).

Figure 2F:
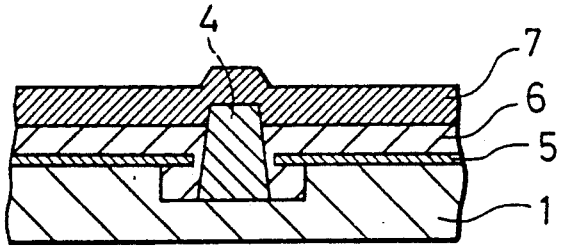
Figure 2G:
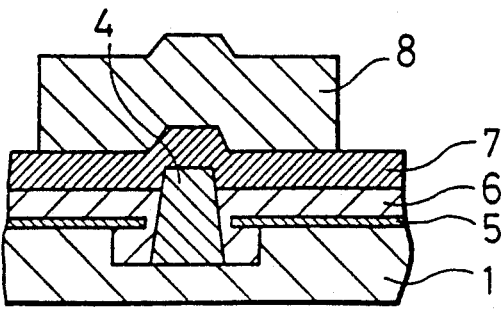
Figure 3A:
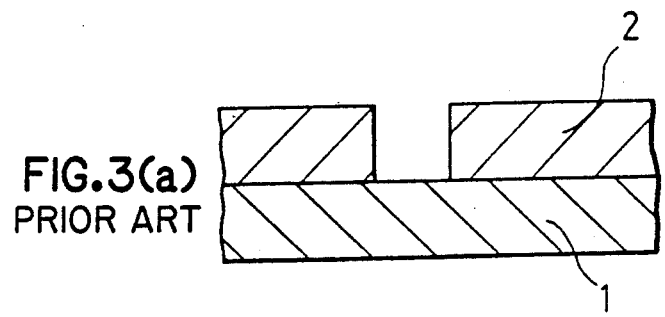
FIGS. 3(a) to 3(d) show cross sectional views of respective production process steps of a prior art method for producing a semiconductor device.
Figure 3B:
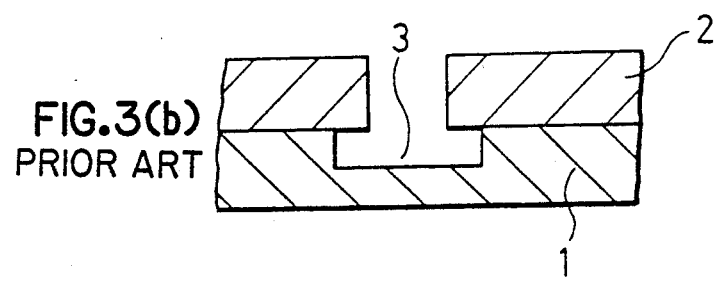
Figure 3C:
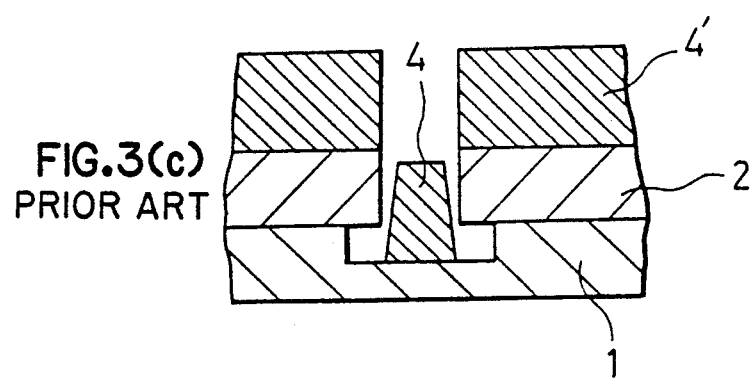
Figure 3D:
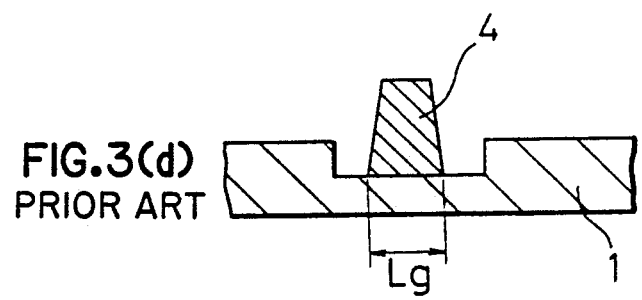

Next, a high conductivity metal 7, such as aluminum or gold, is deposited on the entire surface of substrate to a thickness of about 1 to 2 microns by evaporation (FIG. 2(f)). Thereafter resist 8 is applied on the entire surface of substrate in a thickness exceeding that of the resist 6, and a resist pattern 8 for remaining the high conductivity metal 7 opposite the gate electrode 4 is produced on the gate electrode 4 by photolithography (FIG. 2(g)).

Then, an anisotropic dry etching of the high conductivity metal 7 using the resist pattern 8 as a mask is carried out. Thereafter the width W of the conductivity metal 7' is made a desired value of about 1 to 1.5 microns by wet etching (FIG. 2(h)).

Then, the resist 6 is removed RIE using the resist pattern 8 as a mask. The criterion for determining the etching conclusion point is whether the etching has reached the surface of the spacer 5 disposed between the resist 6 and of the main surface 1 or not. Furthermore, since this spacer is made of glass material, it is possible to etch perpendicular to the substrate with high precision (FIG. 2(i)). Next, ohmic electrodes are produced by evaporation, self-aligning, using the resist pattern 8' as a mask. Then, since the high conductivity metal 7' on the gate electrode 4 is already side-etched, the ohmic electrode metal does not attach to the side face of the conductivity metal 7' (FIG. 2(j)).

Then, unneeded portion of ohmic electrode metals 9' are removed by the lift-off method, and thereafter the remaining resist 6 and spacer 5 are removed. At last, the conductivity metal 7' and the gate electrode 4 are adhered strongly each other by annealing. In this way, a semiconductor device is completed in which a second wide electrode comprising high conductivity metal 7' is produced on the gate electrode 4 and ohmic electrodes 9 are produced self-aligningly on opposite sides of the gate electrode 4 with high precision (FIG. 2(k)). In such a second embodiment, similarly as in the first embodiment, the gate length (Lg) of the gate electrode 4 can be reduced and the cross sectional area of the gate electrode can be increased, thereby reducing the gate resistance (Rg). In addition, since the ohmic electrodes are produced self-aligningly, the distances $L_{SG}$ and $L_{SD}$ between the gate electrode 4 and the ohmic electrodes 9 can be reduced, thereby reducing the gate to source resistance and gate to drain resistance. Accordingly, the minimum noise figure is reduced and the gain is increased thereby providing a semiconductor device having a high performance especially at high frequencies.

In the above described first and second embodiment, the material of the gate electrode 4 and the high conductivity metal 7' are both aluminum. However, the present invention is not restricted thereto, and both metal elements may be gold. Furthermore, aluminum may be used for the gate electrode 4 and gold may be used for the high conductivity metal 7'. In this case, however, in order to prevent the alloying reaction between aluminum and gold, it is necessary to provide a barrier metal, such as titanium or molybdenum, between the gate electrode 4 and high conductivity metal 7'.

As discussed above, according to the present invention, a gate electrode having a reduced gate length (Lg) is produced by evaporating a gate electrode material using a narrow gate pattern as a mask, the gate electrode portion is buried by a resist, the resist is etched to expose the top portion of the gate electrode on the surface of the resist, and a high conductivity metal is plated on the top portion of the gate electrode by electroless plating. Thereafter, ohmic electrodes are produced. Otherwise, the top portion of the gate electrode is exposed to the surface of the resist as described above, and thereafter, a high conductivity metal is deposited by, for example, evaporation, on the entire surface. The high conductivity metal is etched using a resist pattern to leave a portion thereof on the gate electrode. Thereafter, ohmic electrodes are produced at opposite sides of the gate electrode self-aligningly using the resist pattern which was used as a mask for etching the high conductivity metal. Accordingly, the gate length (Lg) can be reduced and the cross sectional area of the gate electrode can be increased, thereby reducing the gate resistance (Rg). In addition, since ohmic electrodes are produced self-aligningly, the distance between gate electrode and ohmic electrodes can be reduced, thereby reducing the gate to source resistance and gate to drain resistance. This reduces the minimum noise figure and increases the gain in a high frequency field effect transistor, thereby providing a high performance element especially at high frequencies.

What is claimed is:

1. A method of producing a semiconductor device comprising:
   depositing an inert spacer on a surface of a semiconductor substrate;
   depositing a first mask on the spacer;
   forming an aperture in the first mask;
   etching a recess in the surface of the substrate;
   depositing a first metal in the recess as a gate electrode and on the first mask;
   removing unneeded first metal by removing the first mask;
   burying the gate electrode by applying a second mask to the surface of the substrate and the spacer;
   etching the second mask to expose the gate electrode;
   depositing a second metal having a relatively high electrical conductivity on the gate electrode and second mask;
   applying a third mask having a larger thickness than that of the second mask on the second metal opposite the gate electrode;
   etching the second metal where it is not covered by the third mask and at the side walls of the layer of the second metal to produce a stripe of the second metal having a desired width;
   removing the third mask and the spacer except opposite the second mask;
   depositing a third metal to form ohmic electrodes at opposite sides of the gate electrode using the second mask for self-alignment of the ohmic electrodes; and
   annealing the gate electrode and the second metal to improve their adhesion.

2. A method of producing a semiconductor device as defined in claim 1 including depositing aluminum as the first and second metals.

3. A method of producing a semiconductor device as defined in claim 1 including depositing aluminum as the first metal and gold as the second metal.

4. A method of producing a semiconductor device as defined in claim 3 including depositing a barrier metal between the first and second metals.

5. A method of producing a semiconductor device as defined in claim 4 wherein said barrier metal comprises one of titanium and molybdenum.

6. A method of producing a semiconductor device as defined in claim 1 wherein the gate electrode is less than 0.5 micron wide.

7. A method of producing a semiconductor device as defined in claim 1 including depositing a glass material as the spacer.

8. A method of producing a semiconductor device as defined in claim 7 including stopping etching of the third mask when the glass material is reached.

9. A method of producing a semiconductor device as defined in claim 1 including depositing one of $Si_3N_4$ and $SiO_2$ as the spacer.

10. A method of producing a semiconductor device as defined in claim 1 including anisotropically dry etching the second metal using the third mask and wet etching the side walls of the layer of the second metal.

11. A method of producing a semiconductor device as defined in claim 1 including etching the side walls of the second metal to produce a stripe of the second metal about 1 to 1.5 microns wide.

* * * * *